(12) United States Patent
Merwin

(10) Patent No.: US 7,028,651 B1
(45) Date of Patent: Apr. 18, 2006

(54) QUASI RESONANT GATE CONTROLLER FOR A POWER DRIVER

(75) Inventor: Jeffrey D. Merwin, Buffalo Grove, IL (US)

(73) Assignee: Motorola, Inc., Schaumberg, IL (US)

( * ) Notice: Subject to any disclaimer, the term of this patent is extended or adjusted under 35 U.S.C. 154(b) by 0 days.

(21) Appl. No.: 10/958,023

(22) Filed: Oct. 4, 2004

(51) Int. Cl.
*F01L 9/04* (2006.01)

(52) U.S. Cl. .................... 123/90.11; 330/251
(58) Field of Classification Search ............... 330/251; 123/90.11
See application file for complete search history.

(56) References Cited

U.S. PATENT DOCUMENTS 5,543,739 A * 8/1996 Bontempo et al. .......... 327/108

* cited by examiner

*Primary Examiner*—Thomas Denion
*Assistant Examiner*—Zalelem Eshete
(74) *Attorney, Agent, or Firm*—Brian M. Mancini; Terri S. Hughes

(57) ABSTRACT

A drive circuit for a power device includes a power transistor utilized to drive the power device. The drive circuit utilizes a resonant circuit that drives the power transistor at a high current level when the gate of the power transistor is in its Miller region. In one embodiment, the drive circuit includes dual transistors and an inductor tuned to the gate capacitance to drive the gate of the power transistor. The drive circuit may be useful in a variety of areas, such as with a valve controller for a camless engine.

44 Claims, 5 Drawing Sheets

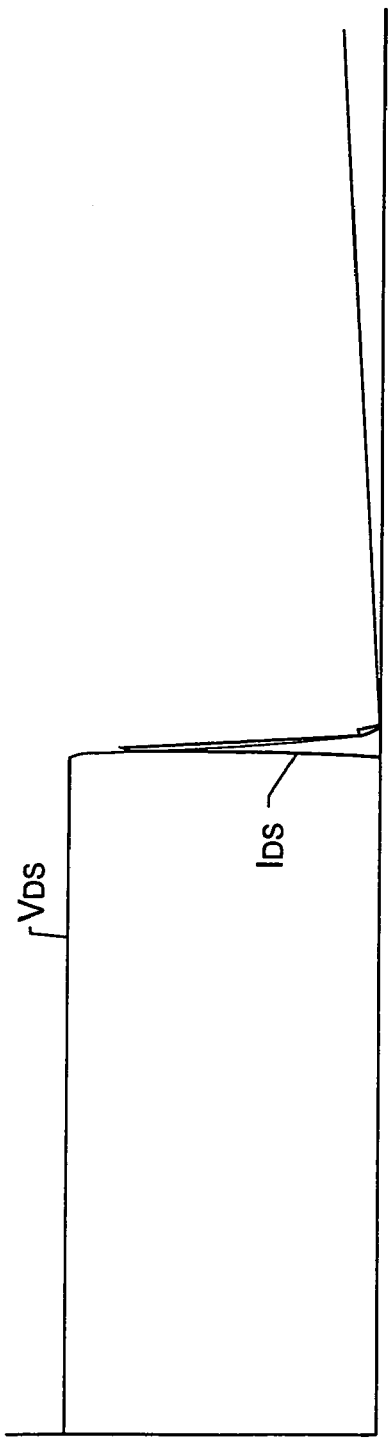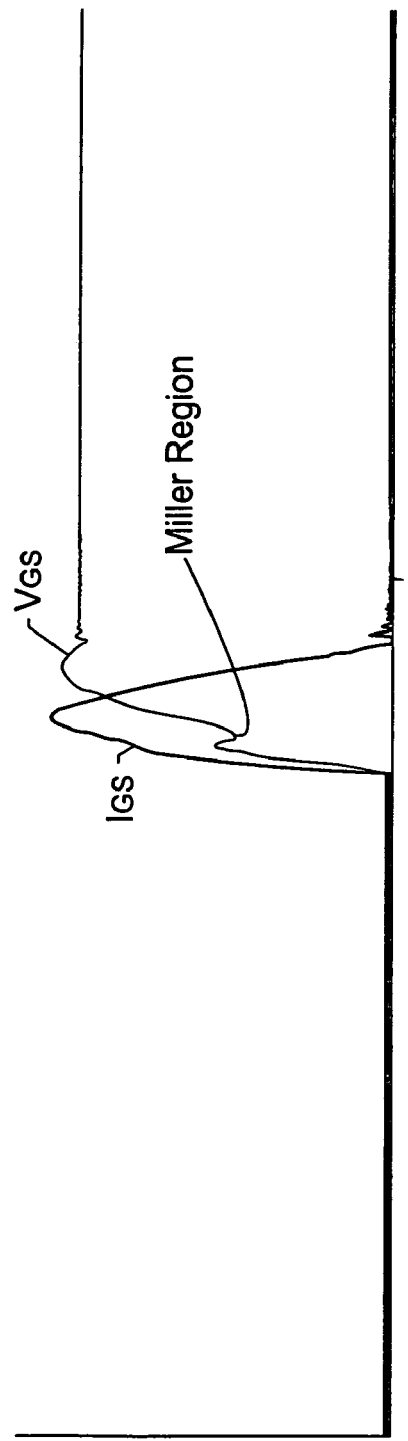
FIG. 4A
FIG. 4B

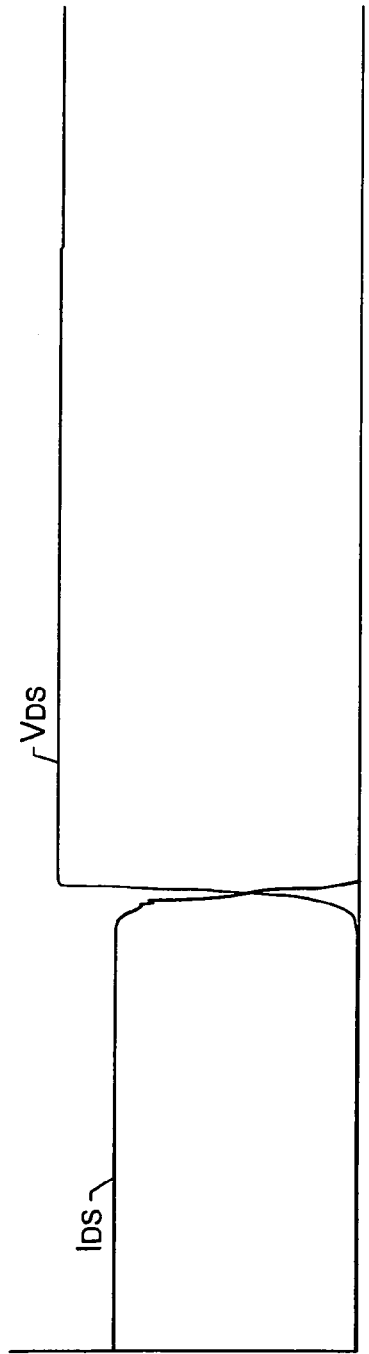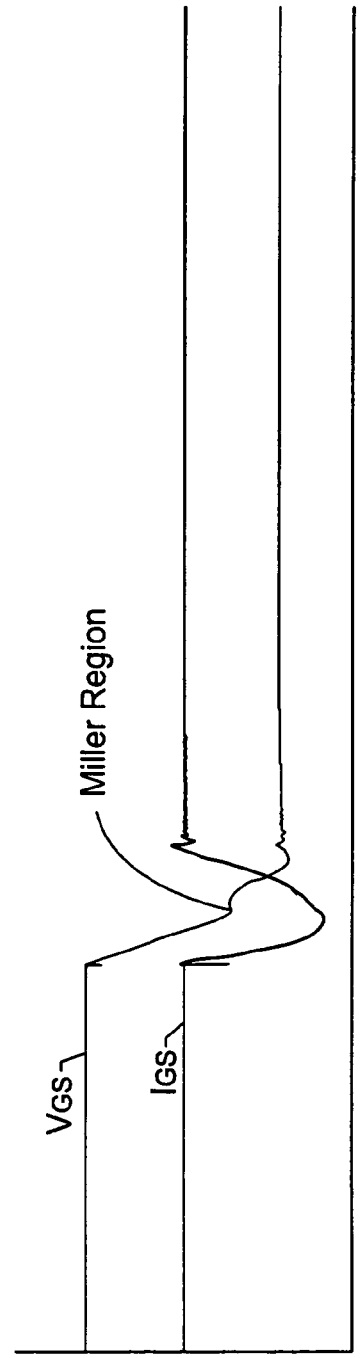

QUASI RESONANT GATE CONTROLLER FOR A POWER DRIVER

FIELD OF THE INVENTION

The present invention relates to generally to gate controllers and, more particularly, to a quasi resonant gate controller for a power driver.

BACKGROUND INFORMATION

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Historically, mechanical systems that require great forces to actuate their moving parts have utilized mechanical and/or hydraulic actuators. As one example, an internal combustion engine contains at least one intake valve and at least one exhaust valve for each cylinder of the engine. As is well known, the intake valve allows air and fuel to flow into the combustion chamber, and the exhaust valve allows the combusted air/fuel mixture to flow out of the chamber. Because the timing of the valves must correspond to the motion of the piston and the injection of fuel into the combustion chamber, conventional internal combustion engines incorporate camshafts to coordinate the timing of the valves with the piston and the fuel injector. Because the camshaft is typically rotated by a belt or chain connected to the engine's crankshaft, the camshaft spins at a speed correlative to the speed of the engine and precisely synchronizes the opening and closing of the valves to the movement of the pistons. Specifically, the camshaft includes a number of camlobes, one corresponding to each valve. During a portion of the cycle, each camlobe mechanically forces its respective valve into an open position against the resistance of a valve spring. During the remainder of the cycle, the valve spring forces the valve back into its closed position and maintains it there.

As can be appreciated, as the size of the valve increases, as engine speeds increase, and as valve opening and closing rates increase, the valve springs must become increasingly stiffer, or more forceful, in order to accommodate such engine designs. As the size and stiffness of the valve springs increase, the energy required to actuate the valves similarly increases. Furthermore, although certain variable cam timing methods exist, typically using variable profile camlobes in conjunction with camshafts that may be longitudinally displaced to some degree, the valve timing of such mechanical actuation mechanisms is generally fixed due to the fact that the camshaft is mechanically driven via the crankshaft. Furthermore, the camlobes are subject to wear, and such wear typically increases as the energy required to open the valves increases. Because worn camlobes adversely affect the opening and closing of the valves, the efficiency of the engine typically decreases and the emissions from the engine increase.

In an effort to increase engine efficiency and decrease engine emissions, manufacturers have developed a variety of engine controls during the past twenty to thirty years. Such engine controls are typically referred to as engine control modules or ECMs. Commercially available ECMs have been limited generally to fuel and spark controls. In other words, most commercially available ECMs electronically control the delivery of fuel to the engine via electromechanically or electrohydraulically actuated fuel injectors. Because fuel injectors are relatively small mechanical devices as compared to the engine valves discussed above, they are relatively easy to actuate electrically in a precise, controllable, and energy efficient manner. ECMs typically utilize sensors to determine the position of the crankshaft and/or camshaft, along with other information, to calculate the correct time and duration for actuating the fuel injectors. ECMs may also include software and/or different fuel injection maps to control operation of the engine in various modes. For example, an ECM may execute a particular strategy to start the engine, another strategy during engine idle, yet another strategy during acceleration, and still another strategy during deceleration.

ECMs such as those described above, generally improve the emissions, fuel efficiency, and operability of engines as compared with their carbureted and mechanically fuel injected counterparts. Indeed, during the past twenty to thirty years, fuel efficiency has roughly doubled; engines start easier, idle smoother, and offer better performance; and emissions are at all time lows. Nevertheless, in spite of the significant improvement, more can still be done.

As one avenue for possible additional improvement, valves mechanically driven by a camshaft may be replaced with electromechanically or electrohydraulically actuated valves to produce a camless engine. Although a camless internal combustion engine was first proposed as early as 1899, when it was suggested that independent control of valve actuation could result in increased engine power, only in about the past decade have researchers investigated camless engine design with a focus on improved energy efficiency, pollution reduction, and reliability, in addition to increased power. Such possibilities include the use of electromagnetic, electropneumatic, and electrohydraulic valves, where electrical solenoids are used to actuate mechanical, pneumatic, or hydraulic valves, respectively. Presumptively, the use of electronics to control valve timing in place of a conventional mechanical camshaft will provide a variety of benefits including increased horsepower, improved energy efficiency, emissions reduction, improved reliability and durability, and better driveability. Because the electronic control of electrically actuated engine valves may enable engines to change timing on the fly, these benefits may be realized.

In regard to improved fuel economy, the electronic control could be programmed to shut down or skip fire one or more of the engine's cylinders when not needed, thus saving fuel. In regard to reduced emissions, because engines emit the majority of their pollutants immediately after ignition when they are still cold, timing could be altered at startup to reduce such emissions. Emissions are proportional to cylinder flame temperature. The flame temperature can be changed not only by changing air fuel ratio and charge volume as it is now, but also by changing the mass and compression in the cylinder. This is now possible with variable valve actuation. In regard to improved driveability, engine timing may be altered to provide a flatter torque curve, resulting in smoother acceleration and deceleration, as well as faster starts. Valve timing also may be altered based on engine temperature and/or load to provide improved response characteristics. In regard to reliability and durability, a camless engine includes no camlobes to wear or timing belts to break. In addition, the seating velocity of electrically actuated valves may be controlled so that the valves close more gently to decrease wear and reduce engine noise.

In addition to the various benefits described above, heavy duty vehicles, such as large on-highway trucks, may benefit even more from camless engine technology. Such vehicles are often equipped with a compression braking mechanism, sometimes referred to as a "jake brake," that augments the braking capability of the vehicle and reduces the wear of the vehicle's conventional friction brakes. It should be appreciated that on-highway trucks must possess similar speed, acceleration, and deceleration capabilities of other vehicles used on the highway. However, the mass and inertia of such vehicles is much larger than that of a passenger car, thus requiring powerful braking mechanisms to enable the driver of an on-highway truck to decelerate safely. Accordingly, the engine of such a vehicle may be provided with a compression braking mechanism that enhances the engine's ability to provide torque braking in compliment to the vehicle's friction brakes. Such a mechanism typically maintains the intake and exhaust valves in the closed position during the compression stroke of the pistons. During compression braking, the fuel injection and combustion cycles are inhibited, so that the energy is dissipated as the pistons compress the air within the combustion chambers. The compressed air is released by opening the exhaust valve at the end of the compression stroke. As can be appreciated, compression brakes typically include complex mechanisms that must be added to the engine to control the valves during the braking process. However, in a camless engine design, this additional weight and complexity may be eliminated, because a compression braking mode may be incorporated into the electronic control of the electrically-actuated engine valves. Secondly, by partially opening the exhaust valve during compression, it is possible to create braking action without the characteristic popping sound associated with engine braking. Thirdly, it is possible to increase the number of compression events by altering the engine cycle to contain only a compression and release cycle. This will further reduce the noise associated with compression braking.

From the above discussion, it is clear that a camless engine may provide a wide variety of benefits as compared with a conventional engine. However, the power consumption, cost, size, and packaging requirements of existing electrically actuated engine valves and their corresponding control circuits have prevented such designs from becoming commercially feasible. Indeed, it should be understood that it is typically advantageous for a vehicle's electronic control devices to be mounted on or near the component that is under control. Accordingly, in the case of an engine control, it is typically advantageous to mount the engine control in the engine compartment and, in fact, typically on or very near the engine. However, in a camless engine control, each engine valve typically includes at least one, and often two to four, electrical coils to ensure that the hydraulic valves associated with each engine valve are controlled properly. In fact, to enable tight control and coil energy recovery, two drivers per coil may be used. As a result, for each valve, a hydraulic valve having four coils and, thus, utilizing eight drivers may be implemented. In an engine having four valves per cylinder, 32 drivers per cylinder would be used. Consequently, in even a four-cylinder engine, 128 drivers would be utilized. From this simple calculation, it can be seen that size and efficiency quickly becomes an issue.

At present, an engine mounted electronic engine control typically must consume below 50–60 watts of power to avoid active cooling. Once the power consumption rises above that level, the engine control typically is packaged in such a manner that it may be cooled using the vehicle's engine coolant, engine oil, hydraulic fluid, or fuel. As can be appreciated, such liquid cooling solutions introduce additional size and complexity into the packaging requirements of the control and add cost as well.

BRIEF DESCRIPTION OF THE DRAWINGS

Advantages of the invention may become apparent upon reading the following detailed description and upon reference to the drawings in which:

FIG. 4A illustrates exemplary curves depicting voltage $V_{DS}$ and current $I_{DS}$ of the gate driver transistor of FIG. 3 during turn-on;

FIG. 4B illustrates exemplary curves depicting gate voltage $V_{GS}$ and gate current $I_{GS}$ of the gate driver transistor of FIG. 3 during turn-on;

FIG. 5A illustrates exemplary curves depicting voltage $V_{DS}$ and current $I_{DS}$ of the gate driver transistor of FIG. 3 during turn-off; and FIG. 5B illustrates curves depicting gate voltage $V_{GS}$ and gate current $I_{GS}$ of the gate driver transistor of FIG. 3 during turn-off.

DETAILED DESCRIPTION OF SPECIFIC EMBODIMENTS

Figure 1:
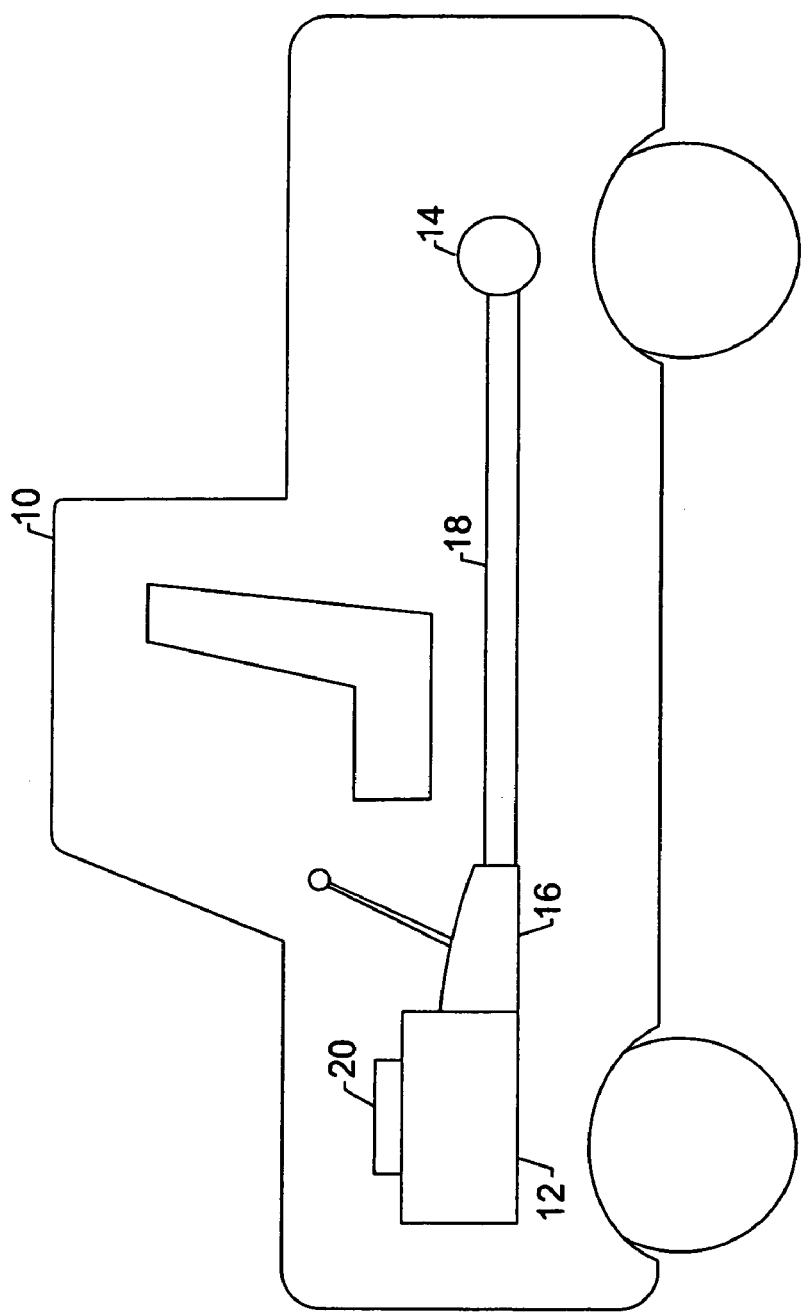
FIG. 1 illustrates a vehicle having an internal combustion engine and an electronic engine control in accordance with the present invention.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One of the primary issues that exist in turning on and off a power transistor, such as a power MOSFET, is the losses that occur during transition from one state to the other state. These losses are commonly referred to as "switching losses." When electronic devices drive external energy storage devices and/or work devices, such as the coils in the electrohydraulic valves used to actuate engine valves as described above, switching losses can be significant. Switching losses may be reduced by reducing the switch transition time. One method of reducing the switch transition time is to drive the power MOSFET very hard. However, the gates of power MOSFETs exhibit an inherent capacitance, and driving the capacitance of the gate of the power MOSFET causes significant power requirements and losses in the gate drive circuitry. Thus, a method of driving a power MOSFET through the transition region quickly, and yet incurring minimal losses, may be advantageous. Indeed, doing so without complex electronics would be particularly advantageous.

The techniques described herein reduce power consumption of the electronic drivers used to drive power devices, such as the electrically actuated valves used in camless engine design. These techniques decrease overall power consumption by significantly reducing switching losses in the power transistors, such as the power MOSFETs, associated with such drivers. These techniques also provide switch timing that is consistent assembly-to-assembly and over a wide temperature range due to the self-resonant nature of the gate drive scheme associated with these techniques. Furthermore, since these techniques utilize relatively smooth waveforms, such as sinusoidal waveforms, high frequency harmonics and electromagnetic emissions are reduced as compared with high speed switching using square waveforms.

As will be explained in reference to the exemplary drive circuitry described in detail herein, the techniques may utilize small-scale semiconductors in conjunction with a resonant gate inductor to allow the gate driver to be small and efficient. Thus, the drivers associated with the present technique may be smaller than conventional drivers and consume less power as well. Because of the reduced power consumption, complex packaging techniques, such as liquid cooling, may be avoided. As for the reduced size, whereas the conventional drivers utilize a $D^2$ PAK surface mount power transistor, which is about ¾×¾ inches in size, the power transistor in the exemplary embodiment may use a DPAK-sized surface mount transistor, which is about one third the size of the $D^2$ PAK surface mount transistor. Accordingly, in addition to a reduction in power consumption, the overall size of the driver section may be significantly reduced. When the size reduction of the circuitry is combined with the attendant packaging benefits, the size of the resulting engine control package may be significantly reduced as well.

The techniques are described herein in reference to driver circuitry utilized in camless engine technology for use in vehicles, generator sets, and the like. However, it should be understood that this is but one exemplary application of such techniques and that such techniques may be beneficial in other applications as well, including: fuel injector drives, permanent magnetic direct current motors, permanent magnetic AC motors, and electric power steering drives. Nevertheless, for the purposes of explaining various aspects of these techniques, the camless engine example discussed herein provides an excellent framework.

Turning now to the drawings, and referring initially to FIG. 1, a vehicle 10 is illustrated and generally designated by a reference numeral 10. In this particular embodiment, it may be presumed that the vehicle 10 is an on-highway truck, but it should be understood that the present techniques may be applicable to camless engines used in a wide variety of other vehicles, such as passenger cars, off-highway trucks, work vehicles, tractors, motorcycles, locomotives, and boats. The exemplary vehicle 10 includes a camless engine 12 that is operably coupled to a differential 14 via a transmission 16 and a drive shaft 18. An engine control module 20, which may include any suitable fuel management control and/or appropriate valve drivers and control circuitry for the camless engine 12, is mounted in the vehicle 10 in an appropriate place, such as on or near the engine 12.

Figure 2:
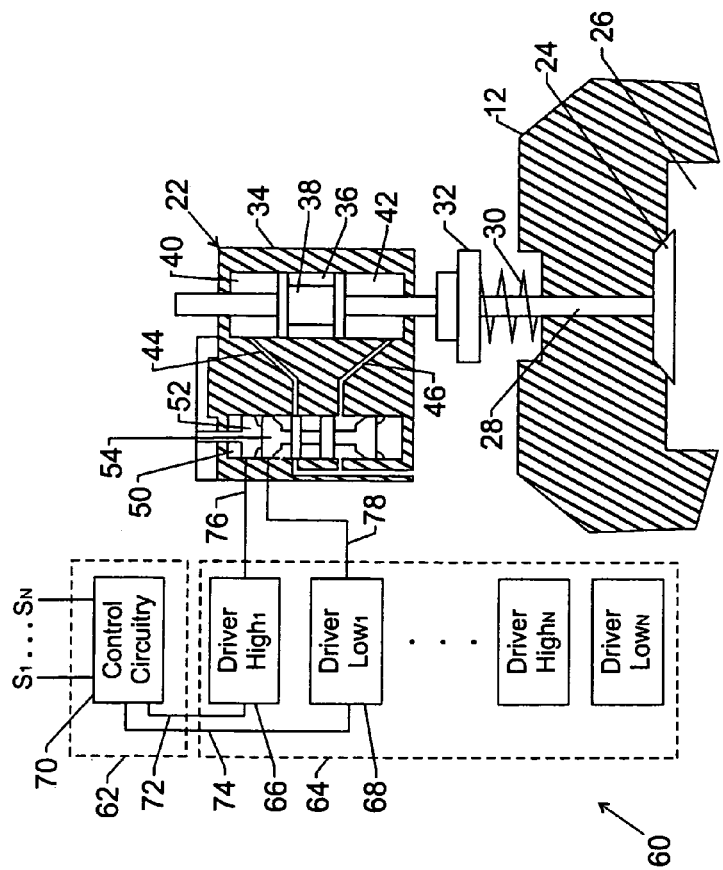
FIG. 2 illustrates drivers, in accordance with the present invention, used in conjunction with control circuitry for actuating an electrohydraulic valve associated with an engine valve of the internal combustion engine illustrated in FIG. 1.

Although electrically actuated engine valves for the engine 12 may take various forms, an electrohydraulically actuated engine valve, such as the electrohydraulic valve 22 illustrated in FIG. 2, will be discussed for the exemplary purposes of the present embodiment. The electrohydraulic engine valve 22 includes a valve body 24, which is illustrated as being closed against its respective valve seat in the top of a combustion chamber 26 of the engine 12. A valve stem 28 extends upwardly from the valve body 24. A valve spring 30 is positioned about a portion of the valve stem 28 and held in position by a flange 32. The valve spring 30 biases the valve stem 28, and thus the valve body 24, upwardly so as to maintain the valve body 24 in a normally closed position.

As illustrated in the present exemplary embodiment, an upper portion of the valve stem 28 is operably coupled to a hydraulic actuator 34. Specifically, the upper portion of the valve stem 28 extends into a reservoir 36. A seal assembly 38 is coupled to the upper portion of the valve stem 28 in a manner which divides the reservoir 36 into an upper portion 40 and a lower portion 42. The upper portion 40 of the reservoir 36 is coupled to a source of hydraulic fluid (not shown) via a port 44, and the lower portion 42 of the reservoir 36 is coupled to the source of hydraulic fluid via a port 46.

Flow of hydraulic fluid through the ports 44 and 46, and thus into and out of the upper portion 40 and the lower portion 42 of the reservoir 36, is controlled by the position of a solenoid 50. When the upper coils 52 and the lower coils 54 of the solenoid 50 are energized, the solenoid 50 moves downwardly so that pressurized hydraulic fluid from the hydraulic source may flow through the port 44 and into the upper portion 40 of the reservoir 36 and so that hydraulic fluid in the lower portion 42 of the reservoir 36 may flow out of the port 46. The pressurized hydraulic fluid in the upper portion 40 of the reservoir 36 creates a pressure differential between the upper portion 40 and the lower portion 42, thus forcing the valve stem downwardly to overcome the upward force of the valve spring 30. As a result, the valve body 24 moves downwardly from its seated position to open the valve.

When the solenoid 50 is de-energized, a spring (not shown) returns the solenoid 50 to its normal position. When the solenoid 50 is in its normal position, the pressurized source of hydraulic fluid is coupled to the lower portion 42 of the reservoir 36 via the port 46, and hydraulic fluid in the upper portion 40 of the reservoir 36 flows out of the upper portion 40 through the port 44. The positive pressure differential created between the lower portion 42 and the upper portion 40 of the reservoir 36, in combination with the upward force of the valve spring 30, moves the valve stem 28 upwardly and returns the valve body 24 to its normally closed position. Through control of the digital valve position, the rate of opening and closing as well as the amount of opening of the engine valve may be controlled.

Valve control circuitry 60 is used to actuate the solenoid 50. In this embodiment, the valve control circuitry 60 is illustrated as part of the engine control module 20, but it should be appreciated that the valve control circuitry 60 may be separate from the engine control module 20. In the illustrated embodiment, the valve control circuitry 60 includes a control section 62 and a driver section 64. The control section 62 and the driver section 64 may be packaged together. Alternatively, because the driver section 64 will typically consume more power than the control section 62 due to the large number of power drivers, the driver section 62 may be packaged as a driver module separate from the control section 62. If the driver section 64 is packaged as a separate module, the control section 62 may be part of the ECM 20 or separate therefrom.

It should be appreciated that the driver section 64 may comprise a large number of drivers depending upon the number of valves 22 in the engine 12 and depending upon the number of coils in their respective solenoids 50. Indeed, in this example, a high-side driver and a low-side driver are utilized to energize each of the coils of each solenoid of each engine valve, although only the high-side driver 66 and the low-side driver 68 for the coil 52 are shown for ease of illustration.

To determine when to signal the high-side driver 66 and the low-side driver 68 to energize and de-energize the coil 52 of the solenoid 50, control circuitry 70 in the control section 62 receives one or more input signals, designated herein as $S_1$. The control circuit 70 receives similar input signals, designated herein through $S_N$ for the other "N" high-side and low-side drivers. The input signal(s) $S_1$ may include any suitable signal that the control circuitry 70 may use to determine, for example, the timing, duration, and/or rate of energization and de-energization of the high-side driver 66 and the low-side driver 68. Such signal(s) and considerations are well known to those of ordinary skill in the art and may include information such as engine speed, rate of acceleration, piston position, throttle position, required torque, block temperature, and gear position. Indeed, it should be understood that any control parameters currently known or utilized in the future may be used in conjunction with the power driver techniques described below.

As a result of processing the input signal(s) $S_1$, the control circuitry 70 delivers one or more driver control signals to the high-side driver 66 and to the low-side driver 68 via control lines 72 and 74, respectively. In response to receiving the driver control signals on the lines 72 and 74, the high-side driver 66 and the low-side driver 68 deliver power drive signals to the upper coil 52 on output lines 76 and 78, respectively.

It should be understood that the electrohydraulic valve 22 is presented for illustrative and exemplary purposes only, as a wide variety of electrohydraulic valves may be used with driver circuits employing the techniques described herein. Indeed, for camless engine applications, one particularly advantageous electrohydraulic valve is model no. HVA-4A available from Sturman Industries. The HVA-4A electrohydraulic valve includes a two-stage actuator, wherein a first stage uses low pressure to move the spool in a three-way proportional valve, and wherein the three-way proportional valve controls the high pressure to the actuator which opens the engine valve. The actuator is a two-stage actuator with variable lift. In other words, the associated driver circuit, such as the valve control circuitry 60, delivers signals to digital valves which control the low pressure hydraulic fluid used to move the spool of the three-way proportional valve. Thus, the valve may be controlled with respect to the precise lift timing, the amount of lift itself, the duration of the lift, and even the seating of the lift to control noise. In other words, the digital valves are opened and closed multiple times for each valve cycle to control these various timing and lift parameters.

Figure 3:
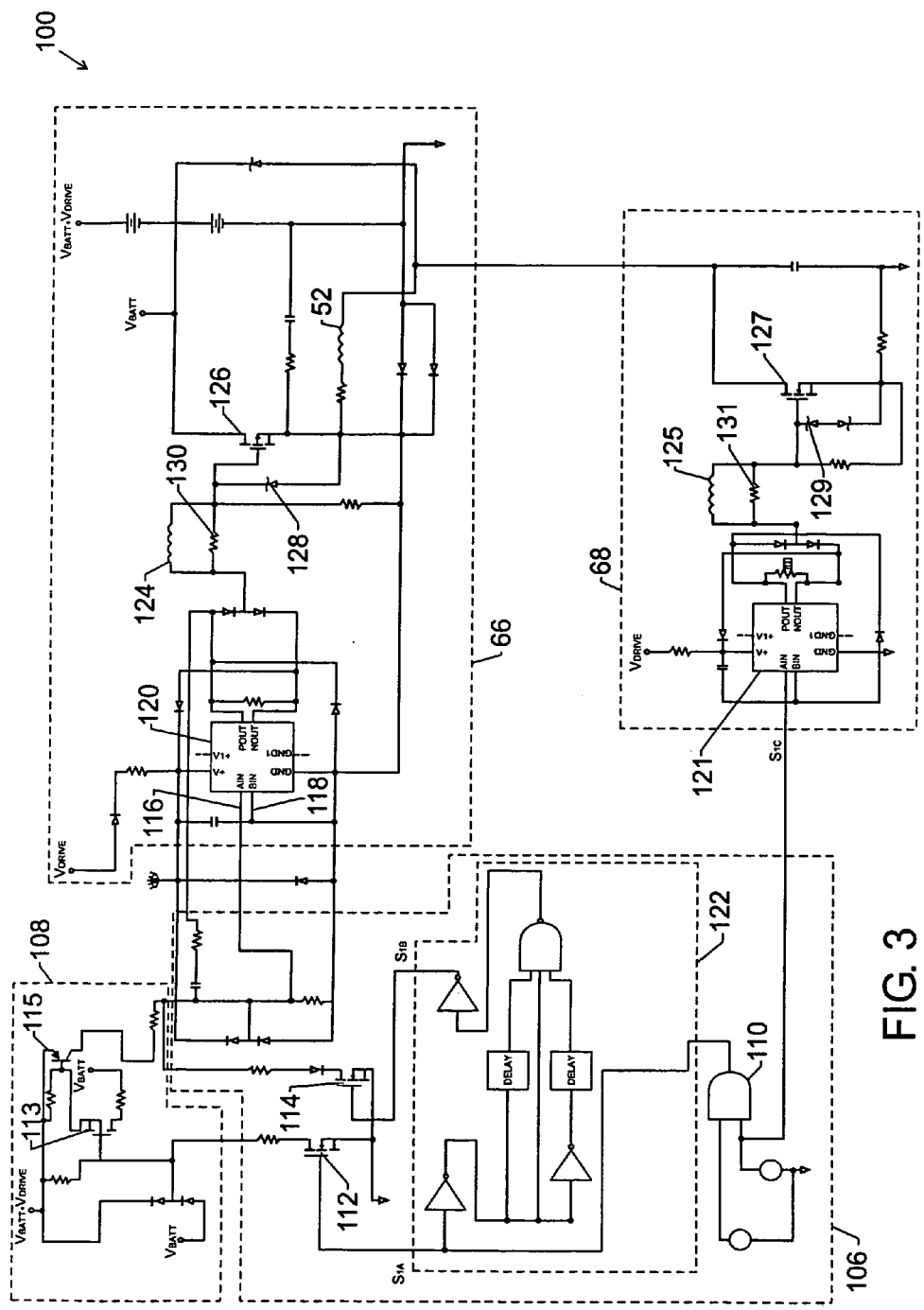
FIG. 3 illustrates an exemplary electrical schematic of the driver illustrated in FIG. 2.

An exemplary driver circuit that may be used for the high-side driver 66 and the low-side driver 68 is illustrated in FIG. 3 and generally designated by a reference numeral 100. The upper coil 52 of the solenoid 50 is illustrated in the circuit 100 as an inductor 52. In the exemplary embodiment, the driver circuit 100 includes a high-side driver circuit 66 that drives the high-side of the inductor 52, a low-side driver circuit 68 that drives the low side of the inductor 52, a logic circuit 106 that activates and deactivates the high-side driver circuit 66 and the low-side driver circuit 68 for testing purposes, and a power source 108 that receives the battery voltage $V_{BATT}$ to provide appropriate levels of power to the circuitry.

Looking first to the gate power source 108, it receives the battery voltage $V_{BATT}$ from the battery (not shown) of the vehicle 10, a low side gate drive supply labeled Vdrive and a Vbatt plus Vdrive supply. However, those of ordinary skill in the art will understand that the voltage source providing main power to the power source 108 may come from a variety of different sources. The power source 108 regulates the battery voltage to provide appropriate voltage levels to the remainder of the driver circuit 100.

In the present embodiment, the logic circuit 106 includes an AND gate 110 that delivers an output signal to the gate of a transistor 112. As discussed previously, an external circuit provides timing signals, to the AND gate 110 for example, to control the opening and closing of the valves. In response to the output signal from the AND gate 110, the transistor 112 turns on. Because the drain of the transistor 112 is coupled to the gate of a transistor 113, it pulls the drain of the transistor 113 to Vbatt, thus turning on the transistor 115. Because the collector of the transistor 115 is operably coupled to the inputs 116 and 118 of a dual transistor package 120, the two transistors (1N channel MOSFET and 1P channel MOSFET) in the dual transistor package 120 turn on the high-side driver 66 to energize the inductor 52 as described in further detail below. The second transistor 114 is used when turning off the high side driver. When turning off the high side driver, transistor 114 is turned on for a short period of time to remove the charge from the logic control input 116. This allows the input 116 to see a clean turn off transition and not be influenced by stray capacitances when the source of the transistor 126 move rapidly towards ground as the transistor 126 turns off. Similarly, one of the signals from the input to the AND gate 110 is delivered to the dual transistor package 121 of the low-side driver 68. This signal causes the two transistors in the dual transistor package 121 to turn on the low-side driver 68 to energize the inductor 52 as described in further detail below.

To turn off the high-side driver 66, the gate of the transistor 112 is brought low. In this embodiment, a deactivation charge removal pulse may be delivered to the transistor 114 by a time delay circuit 122 that also receives the output from the AND gate 110. The low side drive transistor 127 is turned off simultaneously with the high side drive transistor 126 to remove energy quickly from the drive coil or inductor 52. In this particular embodiment, the low side driver 68 is used only to remove energy quickly from the inductor 52. However, it uses the same resonant turn off circuit as does the high side driver 66. In this embodiment, both the high side driver 66 and the low side driver 68 use the same circuit design.

Those of ordinary skill in the art will readily recognize that the logic circuit 106 is meant for testing purposes only and that the timing of the activation and deactivation signals in a production embodiment would be generated by the control circuitry 70 as discussed previously. For example, if the logic circuit was not present, control signals $S_{1A}$, $S_{1B}$, and $S_{1C}$, may be delivered by the control circuitry 70 (in response to receiving the input signal $S_1$) to the high-side driver 66 and to the low-side driver 68 to activate and deactivate the high-side driver 66 and the low-side driver 68.

The high-side driver 66 and the low-side driver 68 may be activated and deactivated at the same time. When the high-side driver circuit 66 and the low-side driver circuit are activated, the positive outputs $P_{OUT}$ of the transistor packages 120 and 121 transition to a high logic level, while the negative outputs $N_{OUT}$ remain at a low logic level. The voltages generated at the positive outputs $P_{OUT}$ build energy into a resonant inductor 124 and a resonant inductor 125, respectively, by forcing current into them. Current is also delivered to the gate of the drive transistors 126 and 127. As the voltages across the resonant inductors 124 and 125 reach zero, voltages on the gates of the drive transistors 126 and 127 rise above the level of the drive voltage $V_{DRIVE}$ due to the current still flowing in inductors 124 and 125. Therefore, energy rings up until the current delivered by the resonant inductors 124 and 125 stops. This begins resonance, which is stopped by the diodes 128 and 129. The resistors 130 and 131 limit the magnitude of the ring.

The operation of the high-side and low-side drivers 66 and 68 may be better understood by reference to FIGS. 4A and 4B, which illustrate various waveforms related to the drive transistor 126, with the understanding that the drive transistor 127 will act similarly. As the gate current $I_{GS}$, and thus the gate voltage $V_{GS}$, of the drive transistor 126 rises, the drive transistor 126 turns on. As the drive transistor 126 turns on, the drain-to-source voltage $V_{DS}$ falls rapidly, and the drain current $I_{DS}$ rises rapidly. However, it should be understood that field effect transistors, such as the transistor 126, exhibit a high gate capacitance. This capacitance is exacerbated due to the fact that the gate voltage $V_{GS}$ and the drain-to-source voltage $V_{DS}$ are both changing at the same time. When the voltages on each side of a capacitor (or a capacitance) change at the same time, a phenomenon occurs that has been labeled the "Miller effect." This effect can be understood as a capacitance coupled from the gate of a MOSFET to the drain of a MOSFET. When the drain voltage is falling due to the device turning on, this capacitance will cause a current to flow into the gate control node. This current has the effect of opposing the signal that is trying to turn the gate, and therefore the MOSFET, on. Since this is a capacitive effect, the faster the voltage on the drain of the MOSFET changes, the higher the current will be that opposes the desirable action.

Looking to the gate voltage $V_{GS}$, it can be seen that the drive transistor 126 exhibits a similar phenomenon due to its gate capacitance. As illustrated in FIG. 4B, the gate voltage $V_{GS}$ oscillates slightly in the Miller region. It should be understood that it is desirable to turn on the drive transistor 126 as quickly as possible so that the drain-to-source voltage $V_{DS}$ switches quickly and, thus, dissipates less power. In other words, the drive transistor 126 operates most efficiently when it is fully on or fully off rather than being in a switching or transition period. Accordingly, to turn the drive transistor 126 on as quickly as possible, it is desirable to drive high current through the gate to oppose the Miller effect. As illustrated in FIG. 4B, the gate current $I_{GS}$ is already high (at least 80% of its maximum magnitude), and continues to rise, when the gate voltage $V_{GS}$ is in the Miller region. As a result, the drain-to-source voltage $V_{DS}$ switches quickly and consumes less power as illustrated in FIG. 4A.

To turn off the drive transistor 126, the positive output $P_{OUT}$ of the dual transistor package 120 returns to a logic zero, and the negative output $N_{OUT}$ transitions to a high logic level. As illustrated in FIGS. 5A and 5B, as the gate current $I_{GS}$, and thus the gate voltage $V_{GS}$, begin to fall, the drive transistor 126 turns off. This causes the drain-to-source voltage $V_{DS}$ to rise and the drain current $I_{DS}$ to fall. More specifically, as the drive transistor 126 turns off, the gate capacitance discharges through the inductor 124, which is now empty, as well as through the resistor 130, and back to ground. The value of the resonant inductor 124 is tuned relative to the gate capacitance to keep current levels relatively high in the Miller region. Indeed, in FIG. 5B, the Miller region can be seen in the discontinuity of the otherwise relatively smooth transition of the gate voltage $V_{GS}$. The magnitude of the gate current $I_{GS}$ is already high (again at least 80% of its maximum magnitude) while the gate voltage $V_{GS}$ is in the Miller region, thus driving the driver transistor 126 through the Miller region as quickly as possible. As a result, the driver transistor 126 turns off rapidly and dissipates less power as a result.

While the invention may be susceptible to various modifications and alternative forms, specific embodiments have been shown by way of example in the drawings and have been described in detail herein. However, it should be understood that the invention is not intended to be limited to the particular forms disclosed. For example, as stated above, the present invention may be employed in any number of modalities such as airplanes, marine craft or generator sets. Rather, the invention is to cover all modifications, equivalents, and alternatives falling within the spirit and scope of the invention as defined by the following appended claims.

What is claimed is:

1. A drive circuit for a power device, comprising:
   a high side driver having a first power transistor adapted to couple to a first end of a drive coil, the high side driver having a first inductor tuned to a gate capacitance of the first power transistor to supply at least 80% of maximum current to the gate of the first power transistor as the gate capacitance of the first power transistor transitions through its Miller region; and
   a low side driver having a second power transistor adapted to couple to a second end of the drive coil, the low side driver having a second inductor tuned to a gate capacitance of the second power transistor to supply at least 80% of maximum current to the gate of the second power transistor as the gate capacitance of the second power transistor transitions through its Miller region.

2. The drive circuit, as set forth in claim 1, wherein the high side driver comprises first dual transistors operably coupled to the control logic gate of the first power transistor to selectively activate and deactivate the first power transistor.

3. The drive circuit, as set forth in claim 1, wherein the low side driver comprises second dual transistors operably coupled to the gate of the second power transistor to selectively activate and deactivate the second power transistor.

4. A controlled drive circuit for a power device, comprising:
   a high side driver having a first power transistor adapted to couple to a first end of a drive coil, the high side driver having a first inductor tuned to a gate capacitance of the first power transistor to supply at least 80% of maximum current to the gate of the first power transistor as the gate capacitance of the first power transistor transitions through its Miller region;
   a low side driver having a second power transistor adapted to couple to a second end of the drive coil, the low side driver having a second inductor tuned to a gate capacitance of the second power transistor to supply at least 80% of maximum current to the gate of the second power transistor as the gate capacitance of the second power transistor transitions through its Miller region; and a control circuit operably coupled to the high side driver and to the low side driver, the control circuit being adapted to selectively activate and deactivate the high side driver and the low side driver.

5. The controlled drive circuit, as set forth in claim 4, wherein the high side driver comprises first dual transistors operably coupled to the gate of the first power transistor to selectively activate and deactivate the first power transistor.

6. The controlled drive circuit, as set forth in claim 4, wherein the low side driver comprises second dual transistors operably coupled to the gate of the second power transistor to selectively activate and deactivate the second power transistor.

7. The controlled drive circuit, as set forth in claim 4, wherein the control circuit is adapted to receive at least one input signal and to deliver at least one control signal to the high side driver and to the low side driver in response to the at least one input signal.

8. An engine control module, comprising:
a fuel management control; and
a valve management control, the valve management control comprising;
a high side driver having a first power transistor adapted to couple to a first end of a drive coil, the high side driver having a first inductor tuned to a gate capacitance of the first power transistor to supply at least 80% of maximum current to the gate of the first power transistor as the gate capacitance of the first power transistor transitions through its Miller region;
a low side driver having a second power transistor adapted to couple to a second end of the drive coil, the low side driver having a second inductor tuned to a gate capacitance of the second power transistor to supply at least 80% of maximum current to the gate of the second power transistor as the gate capacitance of the second power transistor transitions through its Miller region; and
a control circuit operably coupled to the high side driver and to the low side driver, the control circuit being adapted to selectively activate and deactivate the high side driver and the low side driver.

9. The engine control module, as set forth in claim 8, wherein the fuel management control comprises a control adapted to activate and deactivate fuel injectors.

10. The engine control module, as set forth in claim 8, wherein the high side driver comprises first dual transistors operably coupled to the gate of the first power transistor to selectively activate and deactivate the first power transistor.

11. The engine control module, as set forth in claim 8, wherein the low side driver comprises second dual transistors operably coupled to the gate of the second power transistor to selectively activate and deactivate the second power transistor.

12. The engine control module, as set forth in claim 8, wherein the control circuit is adapted to receive at least one input signal and to deliver at least one control signal to the high side driver and to the low side driver in response to the at least one input signal.

13. A camless engine control, comprising:
at least one electrically actuated engine valve, the at least one electrically actuated engine valve comprising at least one solenoid adapted to facilitate movement of the engine valve between open and closed positions; and a valve control circuit for each electrically actuated engine valve, the valve control circuit comprising:
a high side driver having a first power transistor coupled to a first end of a drive coil of the solenoid, the high side driver having a first inductor tuned to a gate capacitance of the first power transistor to supply at least 80% of maximum current to the gate of the first power transistor as the gate capacitance of the first power transistor transitions through its Miller region;
a low side driver having a second power transistor coupled to a second end of the drive coil of the solenoid, the low side driver having a second inductor tuned to a gate capacitance of the second power transistor to supply at least 80% of maximum current to the gate of the second power transistor as the gate capacitance of the second power transistor transitions through its Miller region; and
a control circuit operably coupled to the high side driver and to the low side driver, the control circuit being adapted to selectively activate and deactivate the high side driver and the low side driver to activate and deactivate the solenoid to facilitate movement of the valve between the opened and closed positions.

14. The camless engine control, as set forth in claim 13, wherein the electrically actuated valve comprises a hydraulic control valve operably coupled to the at least one solenoid and to the engine valve, the hydraulic control valve being adapted to facilitate movement of the engine valve between the opened and closed positions in response to movement of the at least one solenoid valve.

15. The camless engine control, as set forth in claim 13, wherein the electrically actuated valve comprises a pneumatic control valve operably coupled to the at least one solenoid and to the engine valve, the pneumatic control valve being adapted to facilitate movement of the engine valve between the opened and closed positions in response to movement of the at least one solenoid valve.

16. The camless engine control, as set forth in claim 13, wherein the high side driver comprises first dual transistors operably coupled to the gate of the first power transistor to selectively activate and deactivate the first power transistor.

17. The camless engine control, as set forth in claim 13, wherein the low side driver comprises second dual transistors operably coupled to the gate of the second power transistor to selectively activate and deactivate the second power transistor.

18. The camless engine control, as set forth in claim 13, wherein the control circuit is adapted to receive at least one input signal and to deliver at least one control signal to the high side driver and to the low side driver in response to the at least one input signal.

19. A camless engine, comprising:
an engine having at least one electrically actuated engine valve, the at least one electrically actuated engine valve comprising at least one solenoid adapted to facilitate movement of the valve between open and closed positions; and
a valve control circuit for each electrically actuated engine valve, the valve control circuit comprising:
a high side driver having a first power transistor coupled to a first end of a drive coil of the solenoid, the high side driver having a first inductor tuned to a gate capacitance of the first power transistor to supply at least 80% of maximum current to the gate of the first power transistor as the gate capacitance of the first power transistor transitions through its Miller region;

a low side driver having a second power transistor coupled to a second end of the drive coil of the solenoid, the low side driver having a second inductor tuned to a gate capacitance of the second power transistor to supply at least 80% of maximum current to the gate of the second power transistor as the gate capacitance of the second power transistor transitions through its Miller region; and a control circuit operably coupled to the high side driver and to the low side driver, the control circuit being adapted to selectively activate and deactivate the high side driver and the low side driver to activate and deactivate the solenoid to facilitate movement of the valve between the opened and closed positions.

20. The camless engine, as set forth in claim 19, wherein the engine comprises an internal combustion engine.

21. The camless engine, as set forth in claim 20, wherein the engine comprises a diesel engine.

22. The camless engine, as set forth in claim 20, wherein the engine comprises a gasoline engine.

23. The camless engine, as set forth in claim 19, wherein the electrically actuated valve comprises a hydraulic control valve operably coupled to the at least one solenoid and to the engine valve, the hydraulic control valve being adapted to facilitate movement of the engine valve between the opened and closed positions in response to movement of the at least one solenoid valve.

24. The camless engine, as set forth in claim 19, wherein the electrically actuated valve comprises a pneumatic control valve operably coupled to the at least one solenoid and to the engine valve, the pneumatic control valve being adapted to facilitate movement of the engine valve between the opened and closed positions in response to movement of the at least one solenoid valve.

25. The camless engine, as set forth in claim 19, wherein the high side driver comprises first dual transistors operably coupled to the gate of the first power transistor to selectively activate and deactivate the first power transistor.

26. The camless engine, as set forth in claim 19, wherein the low side driver comprises second dual transistors operably coupled to the gate of the second power transistor to selectively activate and deactivate the second power transistor.

27. The camless engine, as set forth in claim 19, wherein the control circuit is adapted to receive at least one input signal and to deliver at least one control signal to the high side driver and to the low side driver in response to the at least one input signal.

28. A vehicle system, comprising:

a vehicle having an engine having at least one electrically actuated engine valve, the at least one electrically actuated engine valve comprising at least one solenoid adapted to facilitate movement of the valve between open and closed positions; and a valve control circuit for each electrically actuated engine valve, the valve control circuit comprising:

a high side driver having a first power transistor coupled to a first end of a drive coil of the solenoid, the high side driver having a first inductor tuned to a gate capacitance of the first power transistor to supply at least 80% of maximum current to the gate of the first power transistor as the gate capacitance of the first power transistor transitions through its Miller region;

a low side driver having a second power transistor coupled to a second end of the drive coil of the solenoid, the low side driver having a second inductor tuned to a gate capacitance of the second power transistor to supply at least 80% of maximum current to the gate of the second power transistor as the gate capacitance of the second power transistor transitions through its Miller region; and a control circuit operably coupled to the high side driver and to the low side driver, the control circuit being adapted to selectively activate and deactivate the high side driver and the low side driver to activate and deactivate the solenoid to facilitate movement of the valve between the opened and closed positions.

29. The vehicle system, as set forth in claim 28, wherein the vehicle comprises an on-highway truck.

30. The vehicle system, as set forth in claim 28, wherein the vehicle comprises a passenger car.

31. The vehicle system, as set forth in claim 28, wherein the vehicle comprises an off-highway truck.

32. The vehicle system, as set forth in claim 28, wherein the vehicle comprises a work vehicle.

33. The vehicle system, as set forth in claim 28, wherein the vehicle comprises a tractor.

34. The vehicle system, as set forth in claim 28, wherein the vehicle comprises a motorcycle.

35. The vehicle system, as set forth in claim 28, wherein the vehicle comprises a locomotive.

36. The vehicle system, as set forth in claim 28, wherein the vehicle comprises a boat.

37. The vehicle system, as set forth in claim 28, wherein the engine comprises an internal combustion engine.

38. The vehicle system, as set forth in claim 28, wherein the engine comprises a diesel engine.

39. The vehicle system, as set forth in claim 28, wherein the engine comprises a gasoline engine.

40. The vehicle system, as set forth in claim 28, wherein the electrically actuated valve comprises a hydraulic control valve operably coupled to the at least one solenoid and to the engine valve, the hydraulic control valve being adapted to facilitate movement of the engine valve between the opened and closed positions in response to movement of the at least one solenoid valve.

41. The vehicle system, as set forth in claim 28, wherein the electrically actuated valve comprises a pneumatic control valve operably coupled to the at least one solenoid and to the engine valve, the pneumatic control valve being adapted to facilitate movement of the engine valve between the opened and closed positions in response to movement of the at least one solenoid valve.

42. The vehicle system, as set forth in claim 28, wherein the high side driver comprises first dual transistors operably coupled to the gate of the first power transistor to selectively activate and deactivate the first power transistor.

43. The vehicle system, as set forth in claim 28, wherein the low side driver comprises second dual transistors operably coupled to the gate of the second power transistor to selectively activate and deactivate the second power transistor.

44. The vehicle system, as set forth in claim 27, wherein the control circuit is adapted to receive at least one input signal and to deliver at least one control signal to the high side driver and to the low side diver in response to the at least one input signal.

* * * * *